US006990817B1

(12) United States Patent
Bhatia

(10) Patent No.: US 6,990,817 B1
(45) Date of Patent: Jan. 31, 2006

(54) METHOD AND APPARATUS FOR COOLING ELECTRONIC EQUIPMENT WITHIN AN ENCLOSURE

(75) Inventor: Rakesh Bhatia, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 81 days.

(21) Appl. No.: 10/737,007

(22) Filed: Dec. 16, 2003

(51) Int. Cl.
*F25B 9/02* (2006.01)

(52) U.S. Cl. .......................................... 62/5; 62/259.2

(58) Field of Classification Search ................ 62/5, 62/259.2; 361/691, 692, 694, 695
See application file for complete search history.

(56) References Cited

U.S. PATENT DOCUMENTS

| | | | |
|---|---|---|---|
| 3,165,147 A | * | 1/1965 | Lewis .......................... 165/256 |
| 3,654,768 A | * | 4/1972 | Inglis et al. ...................... 62/5 |
| 5,010,736 A | * | 4/1991 | York et al. ........................ 62/5 |
| 5,823,005 A | * | 10/1998 | Alexander et al. .......... 62/259.2 |
| 6,401,463 B1 | * | 6/2002 | Dukhan et al. ................... 62/5 |
| 6,628,520 B2 | * | 9/2003 | Patel et al. ................. 361/696 |

OTHER PUBLICATIONS

"Packaged Systems Complete System Enclosure Packages"; Bently Nevada Corporation; 2001.

* cited by examiner

*Primary Examiner*—William C. Doerrler
(74) *Attorney, Agent, or Firm*—Meyertons Hood Kivlin Kowert & Goetzel, P.C.; B. Noël Kivlin; Stephen J. Curran

(57) ABSTRACT

A system for cooling electronic assemblies includes an equipment enclosure configured to receive a plurality of electronic assemblies in a plurality of mounting locations. The system also includes a cooling manifold that is mounted to the equipment enclosure and positioned to distribute chilled air to each of the electronic assemblies through a plurality of orifices.

17 Claims, 4 Drawing Sheets

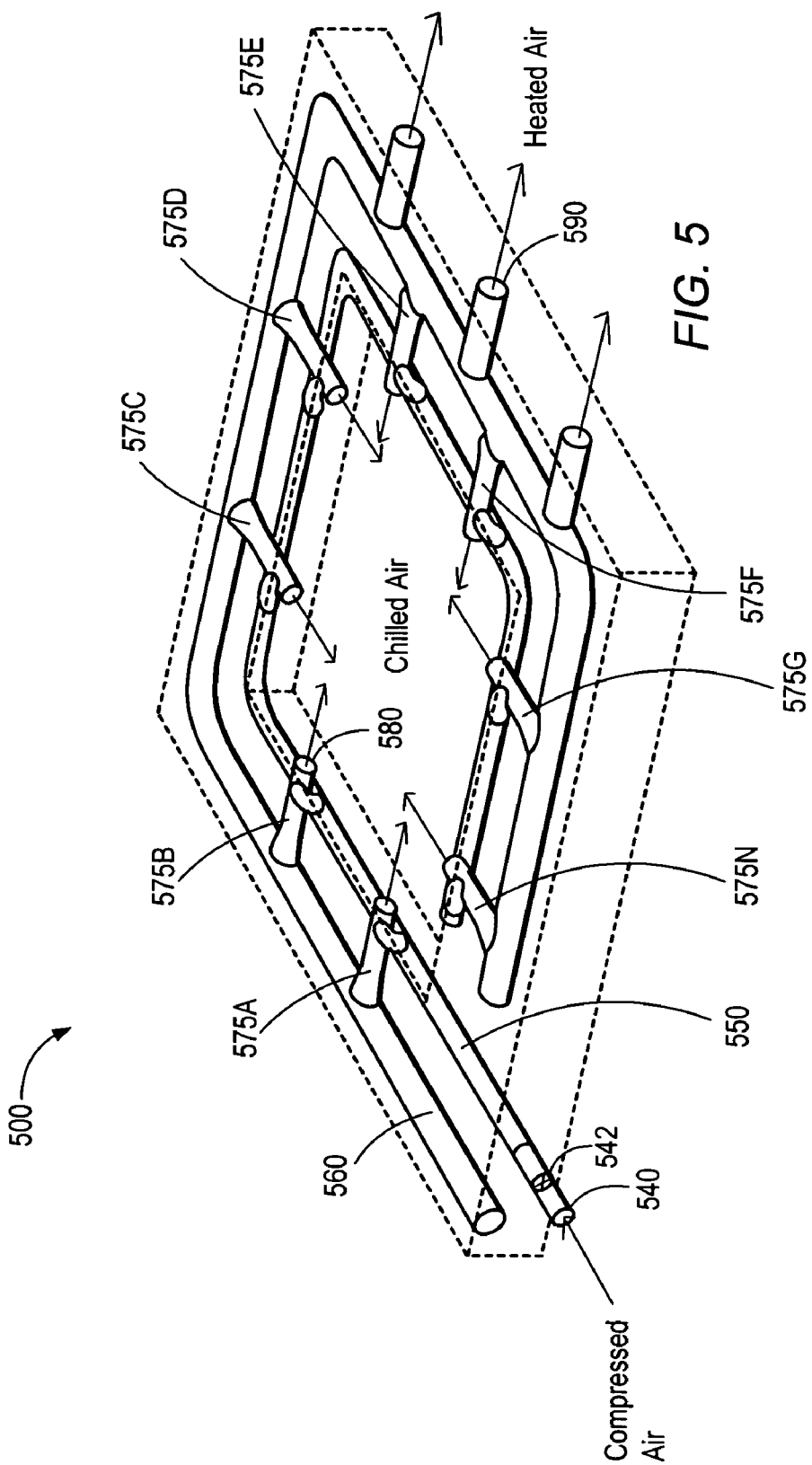

METHOD AND APPARATUS FOR COOLING ELECTRONIC EQUIPMENT WITHIN AN ENCLOSURE

BACKGROUND OF THE INVENTION

1. Field of the Invention

This invention relates to electronic equipment cooling and, more particularly, to using a cooling manifold to distribute chilled air, which is drawn into the electronic equipment.

2. Description of the Related Art

The cooling of electronic equipment is an emerging problem in the electronics industry. This may be especially true of high performance computer processing equipment such as servers, for example. The cooling problem may be exacerbated when the computer equipment is rack-mounted within an enclosure. It is not uncommon to have thermal loads in the 10–20 kW range with even higher loads projected for future systems.

One current equipment cooling approach employs the use of exhaust fans mounted to either the top or the back of an enclosure. The fans exhaust the warmed air out of the enclosure. However, mismatches between the fan and rack arrangements may produce inefficient cooling. Another current cooling approach employs a conventional compressor/condenser type air conditioning unit that is mounted directly on top of or adjacent to the enclosure. The air conditioning unit provides chilled air that may be drawn into the enclosure. However, to meet the cooling needs of high-performance equipment, a large capacity air conditioning unit may be necessary. Such units are expensive, bulky and may require frequent maintenance. In addition, large air plenums may be needed to direct the chilled air from the air conditioning unit into the enclosure.

SUMMARY

Various embodiments of a system and method for cooling electronic assemblies are disclosed. In one embodiment, the system includes an equipment enclosure configured to receive a plurality of electronic assemblies in a plurality of mounting locations. The system also includes a cooling manifold that is mounted to the equipment enclosure and positioned to distribute chilled air to each of the electronic assemblies through a plurality of orifices.

In another embodiment, a cooling manifold for providing chilled air to electronic equipment includes a plurality of vortex tubes distributed along a length of the cooling manifold. Each of the vortex tubes may be configured to generate a portion of the chilled air. The cooling manifold also includes an intake manifold configured to distribute compressed air received at an inlet to the vortex tubes. In addition, the cooling manifold includes an exhaust manifold configured to exhaust warm air away from the vortex tubes.

BRIEF DESCRIPTION OF THE DRAWINGS

FIG. 5 is a detailed diagram of one embodiment of the cooling manifold of FIG. 4.

Figure 1:
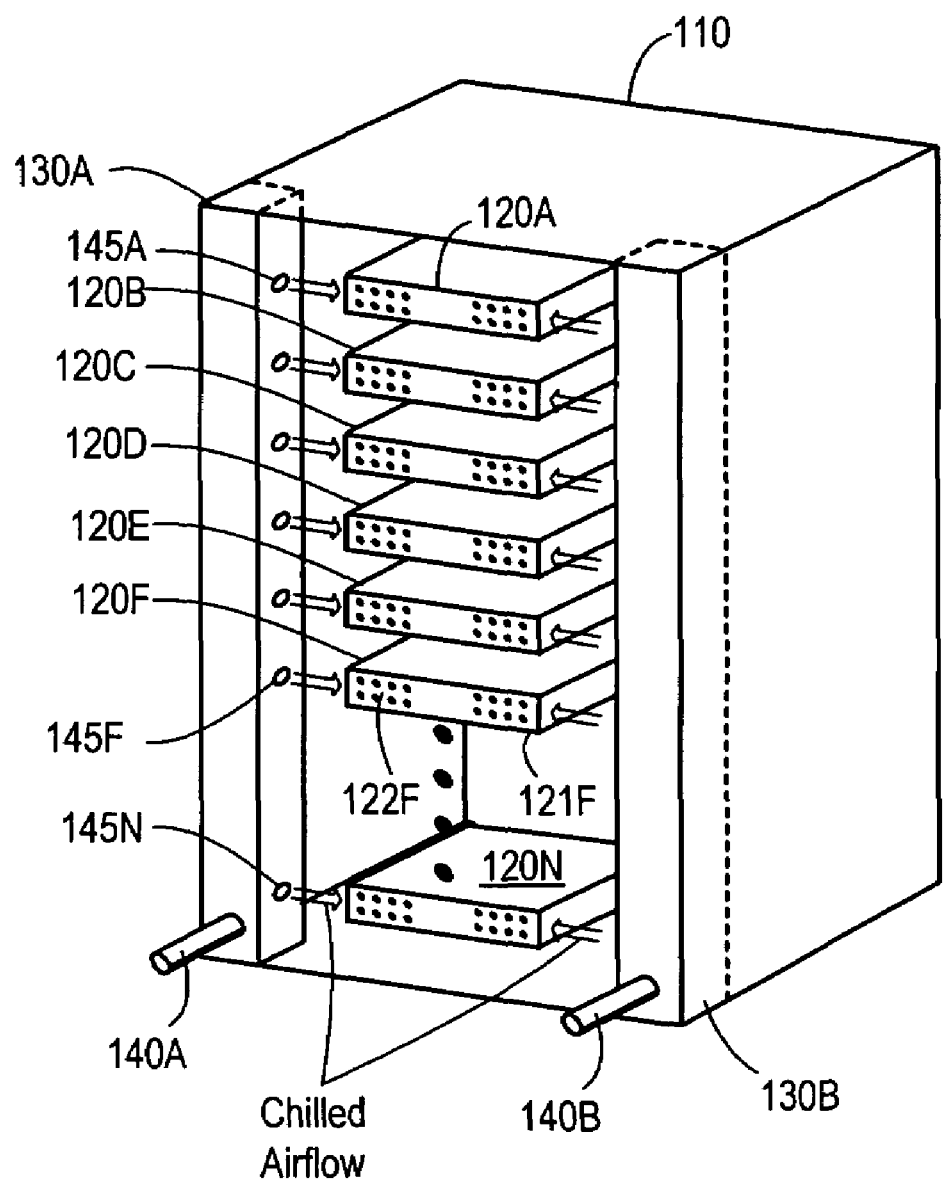
FIG. 1 is a diagram of an equipment enclosure including one embodiment of a cooling manifold.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a diagram of an equipment enclosure including one embodiment of a cooling manifold. Equipment enclosure 110 includes a number of electronic assemblies designated 120A through 120N, where the N is representative of any number. Equipment enclosure 110 also includes two cooling manifolds designated 130A and 130B. It is noted that although two cooling manifolds are shown, it is contemplated that in other embodiments, other numbers of cooling manifolds may be used. It is further noted that components including both a reference number and a reference letter may be referenced by the reference number alone for simplicity.

In one embodiment, equipment enclosure 110 is representative of an equipment cabinet used to house electronic equipment. For example, many computer server racks include such enclosures. Accordingly, equipment enclosure 110 may include a frame (not shown) for supporting an equipment rack. Alternatively, the walls of enclosure 110 may be constructed to support the mounting of equipment (e.g., electronic assemblies 120) directly within equipment enclosure 110.

In the illustrated embodiment, electronic assemblies 120 may be representative of any type of electronic equipment. In one embodiment, each of electronic assemblies 120 may be a computer system such as a server, for example. In one embodiment, each of electronic assemblies 120 may include a housing (e.g., 121F) including a cooling fan (not shown). During operation, the cooling fan may cause cooling air to be drawn in through the front wall of the housing and exhausted through the rear wall of the housing. In such an embodiment, the front wall and rear wall may include ventilation openings (e.g., 122F).

In the illustrated embodiment, cooling manifolds 130A and 130B are mounted within equipment enclosure 110 and positioned such that chilled air is distributed to each of electronic assemblies 120 through a respective orifice 145. Cooling manifolds 130A and 130B are oriented such that the length of cooling manifolds 130A and 130B extend vertically along a height of an inside surface of a respective sidewall of equipment enclosure 110. In one embodiment, to provide the proper alignment of orifices 145 with electronic assemblies 120, each of cooling manifolds 130A–B may be mounted vertically adjacent to the inside surface of the respective sidewall. It is contemplated that each of cooling manifolds 130A–B may be mounted to either the sidewall itself or another structure within equipment enclosure 110 such as the frame, for example. It is noted that although cooling manifolds 130 are illustrated as having a rectangular cross-section, it is contemplated that in other embodiments cooling manifolds 130 may be manufactured to have other shapes.

In one embodiment, chilled air may be forced into air inlet 140. The chilled air exits cooling manifold 130 through the orifices 145. Each orifice 145 is aligned to primarily provide chilled air to one electronic assembly 120. Accordingly, the chilled air that is exhausted through a given orifice 145 may be mixed with the ambient air that is drawn into a given electronic assembly 120 through the front wall ventilation openings 122. Thus, the chilled air mixed with the ambient air may provide enhanced cooling to the electronic assemblies 120 using only a small portion of the interior space of equipment enclosure 110. It is noted that the chilled air may be generated by any type of chiller unit such as an air conditioning unit, for example and provided to air inlet 140 by any suitable means.

However, in another embodiment, cooling manifold 110 may include a number of devices that are capable of generating chilled air locally within cooling manifold 130. In such an embodiment, the devices are vortex tubes, which are described below. As will be described in greater detail below in conjunction with the description of FIG. 3, cooling manifold 130 may include a vortex tube (not shown in FIG. 1) at each orifice 145. Accordingly, compressed air may be applied to air inlet 140 and heated exhaust air may exit through an exhaust port (not shown) on top of cooling manifold 110. In response to the application of compressed air, locally generated chilled air may be provided to each electronic assembly 120 through a respective orifice 145.

Figure 2:
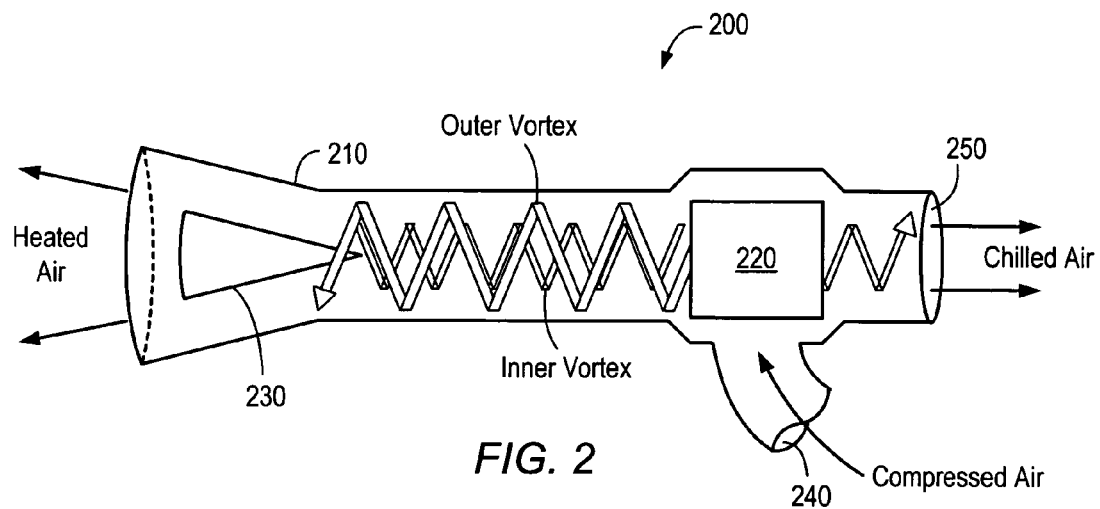
FIG. 2 is a side view diagram of one embodiment of a vortex tube.

Referring to FIG. 2, a side view diagram of one embodiment of a vortex tube is shown. Vortex tube 200 includes a tube body 210 including an outlet valve 230, a compressed air inlet 240, a chilled air orifice 250 and a nozzle 220.

In one embodiment, compressed air is supplied to air inlet 240. Depending on the implementation, the inlet pressure may be regulated to be high enough to cause sufficient cooling of the chilled air exiting chilled air orifice 250. In one embodiment, compressed air in the 50–100 PSIG range may be applied, although other ranges are possible and contemplated. In response to the compressed air being applied at air inlet 240, heated exhaust air will exit through outlet valve 230 and chilled air will exit through chilled air orifice 250. The vortex tube 200 and the mechanism which produces this separation of temperatures is not new. Depending on the pressure applied at air inlet 240 and the setting of outlet valve 230, the chilled air temperature at orifice 250 may be regulated to approximately –50 degrees C.

Generally speaking a vortex tube is a device which separates compressed air into chilled air and heated air; thereby providing each to a separate end of the tube. The actual energy transfer mechanism is speculative. However, the operation of a vortex tube is well known. Compressed air is applied at an input air inlet (e.g., air inlet 240). The compressed air is injected into a tangential nozzle (e.g., nozzle 220) configured to cause the injected air to spin at near sonic speed in a vortex (e.g., outer vortex) toward one end of the tube (e.g. outlet valve 230). The end of the tube includes a restriction shaped such that a portion of the spiraling air is expelled as heated air (e.g., hot air exhaust). Another portion of the air is forced back toward the nozzle in a tighter spiral (e.g., inner vortex) that is inside of the outer vortex. This inner spiral is expelled through the chilled air orifice 250. As mentioned above, the chilled air may be expelled at some –50 degrees C., while the compressed air may be at temperatures near ambient room temperature, for example.

As described in greater detail below, several vortex tubes may be used as chilled air sources to provide a distribution of chilled air to the electronic assemblies 120 within equipment enclosure 110 of FIG. 1.

Figure 3:
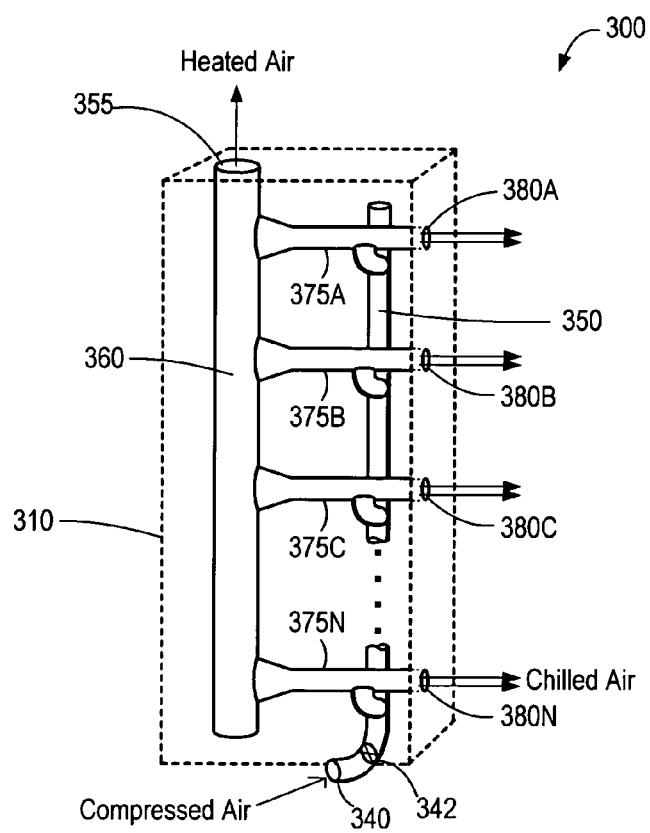
FIG. 3 is a detailed diagram of one embodiment of the cooling manifold of FIG. 1.

Turning to FIG. 3, a detailed diagram of one embodiment of the cooling manifold of FIG. 1 is shown. Cooling manifold 300 includes an intake manifold 350 including a compressed air inlet 340 and an inlet valve 342. In addition, cooling manifold 300 includes an exhaust manifold 360. Further, cooling manifold 300 includes a number of vortex tubes designated 375A through 375N, where N is representative of any number. As described above and illustrate in FIG. 3, each vortex tube 375 includes a chilled air orifice 380. It is noted that cooling manifold 300 may be representative of cooling manifold 130A and 130B of FIG. 1. It is further noted that vortex tubes 375A–N may each be representative of a vortex tube such as vortex tube 200 of FIG. 2.

In the illustrated embodiment, compressed air may be applied at air inlet 340. The compressed air may be turned on and off at inlet valve 342 and in one embodiment, inlet valve 342 may include a pressure regulator (not shown) that may be used to regulate the compressed air pressure inside intake manifold 350. The compressed air is distributed to the air inlet of each of vortex tubes 375A–N. As described above, the compressed air enters vortex tubes 375 causing chilled air to be expelled from each orifice 380. Further, heated air is expelled from each of vortex tube 375 A–N. The heated air enters exhaust manifold 360 and is exhausted through a top opening 355 of exhaust manifold 360.

In one embodiment, cooling manifold 300 may include a housing 310 as denoted by the dashed lines for mounting cooling manifold 300 to a structure such as equipment enclosure 110 of FIG. 1, for example. In another embodiment, cooling manifold 300 may include other mounting hardware for mounting cooling manifold 300.

Many conventional cooling systems use some form of automated temperature control/feedback to control the speed of the cooling fans, which may help improve the cooling ability of the fan system. In one embodiment, the temperature of the chilled air enhanced cooling that enters electronic assemblies 120 may be automatically regulated to provide a predetermined temperature setpoint. For example, any conventional temperature sensing and control unit (not shown) that measures the temperature within electronic assemblies 120 and provides one or more control signals for temperature regulation may be used. In one embodiment, the chilled air temperature that is expelled from orifices 145 of cooling manifolds 130A and 130B may be controlled by increasing and decreasing the compressed air pressure inside intake manifold 350 in response to a control signal from such a temperature sensing and control unit. In such an embodiment, the control signal may control the pressure regulator (not shown) included as part of inlet valve 342. In another embodiment, the control signal may control the setting of the outlet valves (not shown in FIG. 3) of each of vortex tubes 375 to regulate the chilled air temperature that is expelled from orifices 145 of cooling manifolds 130A and 130B.

It is noted that the various manifolds which make up cooling manifold 300 are illustrated having a particular arrangement. However, it is contemplated that in other embodiments the various manifolds and vortex tubes may be configured in any suitable arrangement having a similar interconnection.

Figure 4:
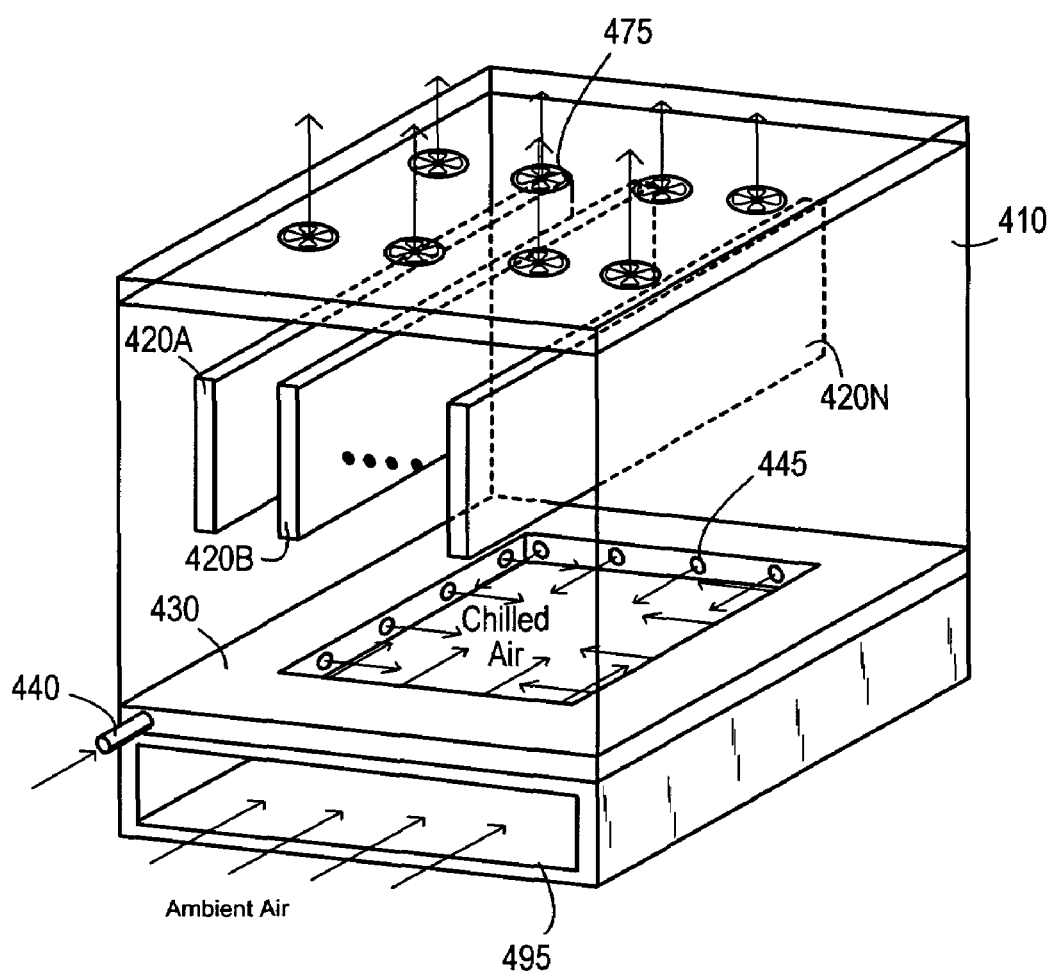
FIG. 4 is a diagram of an equipment enclosure including another embodiment of a cooling manifold.

Referring to FIG. 4, a diagram of an equipment enclosure including another embodiment of a cooling manifold is shown. Equipment enclosure 410 includes a number of electronic assemblies designated 420A through 420N, where the N is representative of any number. Electronic assemblies 420 are mounted vertically within equipment enclosure in vertical mounting locations. In addition, equipment enclosure 410 includes an air plenum 495 for channeling external cooling air into equipment enclosure 410. Equipment enclosure 410 also includes an exhaust fan assembly 475 including a plurality of cooling fans. Equipment enclosure 410 also includes a cooling manifold 430. It is noted that although one cooling manifold is shown, it is contemplated that in other embodiments, other numbers of cooling manifolds may be used. Further, it is contemplated that in other embodiments, additional fan assemblies may be used. For example, an intake fan assembly (not shown) may be used to supplementally draw cooling air into equipment enclosure 410.

In the illustrated embodiment, equipment enclosure 410 is an equipment cabinet used to house electronic assemblies such as electronic assemblies 420, for example. In one embodiment, equipment enclosure 410 may include a frame (not shown) for supporting electronic assemblies 420. Alternatively, the walls of enclosure 410 may be constructed to support the mounting of equipment (e.g., electronic assemblies 420) directly within equipment enclosure 410.

In the illustrated embodiment, electronic assemblies 420 may be representative of any type of electronic equipment. In one embodiment, each of electronic assemblies 420 may be a computer server such as a blade server, for example. During operation, exhaust fan assembly 475 may cause air external to equipment enclosure 410 to be drawn in through air intake plenum 495. The cooling air may be pulled up through the center of cooling manifold 430, across electronic assemblies 420 and exhausted through the top of equipment enclosure 410 by exhaust fan assembly 475.

In the illustrated embodiment, cooling manifold 430 is mounted within equipment enclosure 410 and positioned such that chilled air is distributed to electronic assemblies 420 through chilled air orifices 445. Cooling manifold 430 is oriented such that the length of cooling manifold 430 extends horizontally around a perimeter of an inside surface of the sidewalls of equipment enclosure 410. Chilled air orifices 445 distribute chilled air inward from the perimeter and toward the center of equipment enclosure 410. It is contemplated that cooling manifold 430 may be mounted to the sidewalls of equipment enclosure 410 or another structure within equipment enclosure 410 such as the frame (not shown), for example. It is noted that although cooling manifold 430 is illustrated as having a rectangular cross-section, it is contemplated that in other embodiments cooling manifold 430 may be manufactured to have other shapes.

In one embodiment, cooling manifold 430 includes an air inlet 440, and chilled air orifices 445. Chilled air may be forced into air inlet 440. Chilled air exits cooling manifold 430 through the chilled air orifices 445. Accordingly, the chilled air that is exhausted through the orifices 445 may be mixed with the ambient air that is drawn into equipment enclosure 410 through air plenum 495. Thus, the chilled air mixed with the ambient air may provide enhanced cooling to the electronic assemblies 420 using only a small portion of the interior space of equipment enclosure 410. It is noted that the chilled air may be generated by any type of chiller unit such as the air conditioning unit described above, for example, and provided to air inlet 440 by any suitable means.

In another embodiment, cooling manifold 430 may include a number of vortex tubes (not shown in FIG. 4) that are capable of generating chilled air locally within cooling manifold 430. As will be described in greater detail below in conjunction with the description of FIG. 5, cooling manifold 130 may include a vortex tube (not shown in FIG. 1) at each of orifices 445. Accordingly, compressed air may be applied to air inlet 440 and heated exhaust air may exit through heated air exhaust ports (not shown in FIG. 4) on the sides of equipment enclosure 410. In response to the application of compressed air, locally generated chilled air may be expelled through orifices 445. This chilled air may be mixed with the ambient air that is drawn into equipment enclosure 410 through air plenum 495; thereby providing enhanced cooling as described above.

Turning to FIG. 5, a detailed diagram of one embodiment of the cooling manifold of FIG. 4 is shown. Cooling manifold 500 includes an intake manifold 550 including a compressed air inlet 540 and an inlet valve 542. In addition, cooling manifold 500 includes an exhaust manifold 560. Further, cooling manifold 500 includes a number of vortex tubes designated 575A through 575N, where N is representative of any number. As described above and illustrated in FIG. 5, each vortex tube 575 includes a chilled air orifice 580. It is noted that cooling manifold 500 may be representative of cooling manifold 430 of FIG. 4. It is further noted that vortex tubes 575A–N may each be representative of a vortex tube such as vortex tube 200 of FIG. 2.

In the illustrated embodiment, compressed air may be applied at air inlet 540. The compressed air may be turned on and off by inlet valve 542 and in one embodiment, inlet valve 542 may include a pressure regulator that may be used to regulate the compressed air pressure inside intake manifold 550. The compressed air is distributed to the air inlet of each of vortex tubes 575A–N. As described above, the compressed air enters vortex tubes 575 causing chilled air to be expelled from each orifice 580. Further, heated air is expelled from each of vortex tube 575A–N. In the illustrated embodiment, the heated air enters exhaust manifold 560 and is exhausted through several heated air exhaust ports 590 of exhaust manifold 560. It is noted however, that in other embodiments, the heated air may be exhausted through a single exhaust port (not shown) in exhaust manifold 560 similar to exhaust manifold 360 shown in FIG. 3.

It is noted that the various manifolds which make up cooling manifold 500 are illustrated having a particular arrangement. However, it is contemplated that in other embodiments the various manifolds and vortex tubes may be configured in any suitable arrangement having a similar interconnection.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for cooling electronic assemblies, said system comprising:
   an equipment enclosure configured to receive a plurality of electronic assemblies in a plurality of mounting locations; and a cooling manifold mounted to said equipment enclosure and positioned to distribute chilled air to each of said plurality of electronic assemblies through a plurality of orifices;

wherein said cooling manifold includes a plurality of vortex tubes each positioned to generate and provide said chilled air to a respective one of said plurality of electronic assemblies through a respective one of said plurality of orifices.

2. The system as recited in claim 1, wherein said cooling manifold includes an intake manifold configured to distribute compressed air received at an inlet to said plurality of vortex tubes.

3. The system as recited in claim 1, wherein said cooling manifold includes an exhaust manifold configured to exhaust warm air away from said plurality of vortex tubes.

4. The system as recited in claim 1, wherein said cooling manifold is mounted vertically adjacent to a side wall of said equipment enclosure and wherein a length of said cooling manifold extends vertically along a height of an inside surface of said side wall.

5. The system as recited in claim 4, wherein each of said plurality of mounting locations is configured to receive an electronic assembly in a horizontal orientation and wherein said cooling manifold is positioned such that each of said plurality of orifices is aligned to provide chilled air to a respective one of said plurality of mounting locations.

6. The system as recited in claim 1, wherein said cooling manifold is mounted horizontally within said equipment enclosure and includes a length that extends around a perimeter of an inside surface of said equipment enclosure.

7. The system as recited in claim 6, wherein each of said plurality of mounting locations is configured to receive an electronic assembly in a vertical orientation and wherein said cooling manifold is positioned within said equipment enclosure such that said plurality of orifices direct said chilled air inward toward a center of said equipment enclosure.

8. The system as recited in claim 7, wherein said cooling manifold includes a plurality of vortex tubes each positioned to generate and provide said chilled air through a respective one of said plurality of orifices to said plurality of electronic assemblies.

9. The system as recited in claim 8, wherein said cooling manifold includes an intake manifold configured to distribute compressed air received at an inlet to said plurality of vortex tubes.

10. The system as recited in claim 9, wherein said cooling manifold includes an exhaust manifold configured to exhaust warm air away from said plurality of vortex tubes.

11. The system as recited in claim 10, wherein said equipment enclosure includes a fan positioned to cause ambient air mixed with chilled to flow over said plurality of electronic assemblies.

12. The system as recited in claim 1, wherein said cooling manifold is configured to distribute chilled air received at an inlet to said plurality of orifices.

13. A method for cooling electronic assemblies, said method comprising:

providing an equipment enclosure configured to receive a plurality of electronic assemblies in a plurality of mounting locations; and mounting a cooling manifold to said equipment enclosure and positioning said cooling manifold to distribute chilled air to each of said plurality of electronic assemblies through a plurality of orifices in said cooling manifold;

wherein said cooling manifold includes a plurality of vortex tubes each positioned to generate and provide said chilled air to a respective one of said plurality of electronic assemblies through a respective one of said plurality of orifices.

14. The method as recited in claim 13 further comprising forcing chilled air into an inlet of said cooling manifold.

15. The method as recited in claim 13 further comprising distributing through an intake manifold compressed air received at an inlet to said plurality of vortex tubes.

16. The method as recited in claim 14 further comprising exhausting warm air away from said plurality of vortex tubes through an exhaust manifold.

17. A cooling manifold for providing chilled air to electronic equipment, said cooling manifold comprising:

a plurality of vortex tubes distributed along a length of said cooling manifold, wherein each of said plurality of vortex tubes is configured to generate a portion of said chilled air;

an intake manifold configured to distribute compressed air received at an inlet to said plurality of vortex tubes;

an exhaust manifold configured to exhaust warm air away from said plurality of vortex tubes.

* * * * *